(12) United States Patent
Fleitmann et al.

(10) Patent No.: US 10,971,320 B2
(45) Date of Patent: Apr. 6, 2021

(54) SWITCHING DEVICE AND CONTROL METHOD

(71) Applicant: Eaton Intelligent Power Limited, Dublin (IE)

(72) Inventors: Gregor Fleitmann, Kerpen (DE); Hans-Juergen Mader, Dieblich (DE); Daniel Andreas Jansen, Bonn (DE); Bogdan Zabrocki, Neunkirchen-Seelscheid (DE); Ralph Kriechel, Alfter (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 210 days.

(21) Appl. No.: 16/170,063

(22) Filed: Oct. 25, 2018

(65) Prior Publication Data

US 2019/0131100 A1  May 2, 2019

(30) Foreign Application Priority Data

Oct. 27, 2017  (DE) .......................... 102017125309.2

(51) Int. Cl.
| | | |
|---|---|---|
| *H01H 71/12* | (2006.01) | |
| *H05K 7/02* | (2006.01) | |
| *H02H 3/02* | (2006.01) | |
| *H01H 71/40* | (2006.01) | |
| *H01H 71/10* | (2006.01) | |

(52) U.S. Cl.
CPC ........ *H01H 71/125* (2013.01); *H01H 71/123* (2013.01); *H01H 71/1072* (2013.01); *H01H 71/12* (2013.01); *H01H 71/128* (2013.01); *H01H 71/40* (2013.01); *H02H 3/02* (2013.01); *H05K 7/02* (2013.01)

(58) Field of Classification Search
USPC .............................................. 361/23, 30, 76
See application file for complete search history.

(56) References Cited

U.S. PATENT DOCUMENTS

| | | | | |
|---|---|---|---|---|
| 5,483,408 A | * | 1/1996 | Matsko .................. | H02H 3/006 361/94 |
| 6,359,244 B1 | | 3/2002 | Freimuth | |
| 2012/0002391 A1 | * | 1/2012 | Van Weelden ........... | H02H 3/04 361/811 |

FOREIGN PATENT DOCUMENTS

| | | |
|---|---|---|
| DE | 19754071 C1 | 7/1999 |
| DE | 202010002213 U1 | 5/2010 |
| DE | 102009022073 A1 | 11/2010 |

* cited by examiner

*Primary Examiner* — Danny Nguyen
(74) *Attorney, Agent, or Firm* — Leydig, Voit & Mayer, Ltd.

(57) ABSTRACT

A switching device includes: an electronic trip unit; an actuator; a switching mechanism connected via the actuator to the electronic trip unit; a stationary contact; a mobile contact, which is coupled to the switching mechanism; and an alarm module. The alarm module includes: a first, a second, and a third connector; a first relay having a first contact which is connected to the first connector and having a second contact which is connected to the second connector; a second relay with a first contact which is connected to the third connector; and a control unit which is coupled on an output side to a control side of the first relay and to a control side of the second relay, and on the input side to the electronic trip unit.

11 Claims, 5 Drawing Sheets

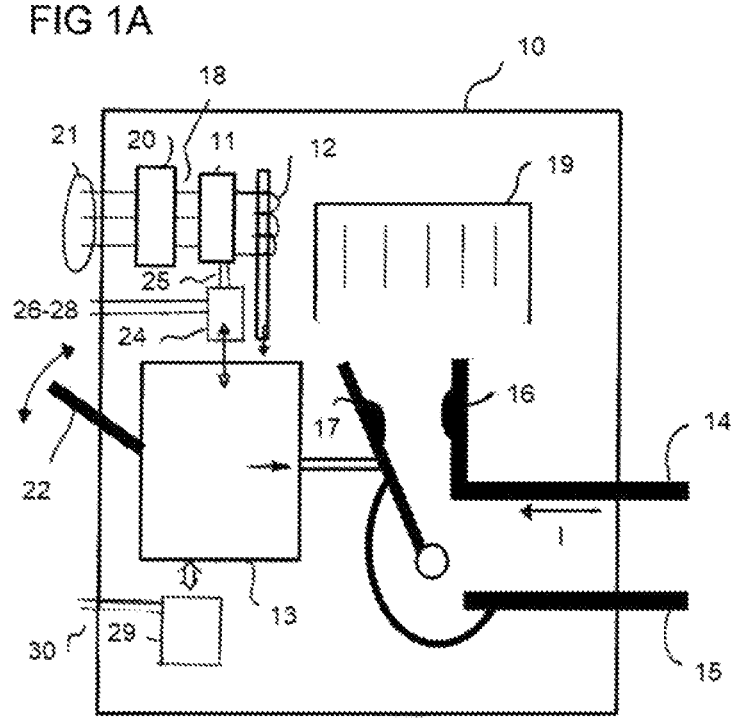

SWITCHING DEVICE AND CONTROL METHOD

CROSS-REFERENCE TO PRIOR APPLICATION

Priority is claimed to German Patent Application No. DE 10 2017 125 309.2, filed on Oct. 27, 2017, the entire disclosure of which is hereby incorporated by reference herein.

FIELD

The present invention relates to a switching device and to a control method.

BACKGROUND

A switching device can be implemented, for example, as a power switch, a motor protection switch, a power protection switch or a load separation switch. Typically, a switching device includes an electronic trip unit, an actuator, and a switching mechanism. The electronic trip unit is coupled via the actuator to the switching mechanism. For the implementation of additional functions with the switching device, information generated in the electronic trip unit can be used.

SUMMARY

In an embodiment, the present invention provides a switching device, comprising: an electronic trip unit; an actuator; a switching mechanism connected via the actuator to the electronic trip unit; a stationary contact; a mobile contact, which is coupled to the switching mechanism; and an alarm module, the alarm module comprising: a first, a second, and a third connector; a first relay having a first contact which is connected to the first connector and having a second contact which is connected to the second connector; a second relay with a first contact which is connected to the third connector; and a control unit which is coupled on an output side to a control side of the first relay and to a control side of the second relay, and on the input side to the electronic trip unit.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIGS. 1A and 1B show examples of a switching device in a schematic representation.

DETAILED DESCRIPTION

Figure 1B:
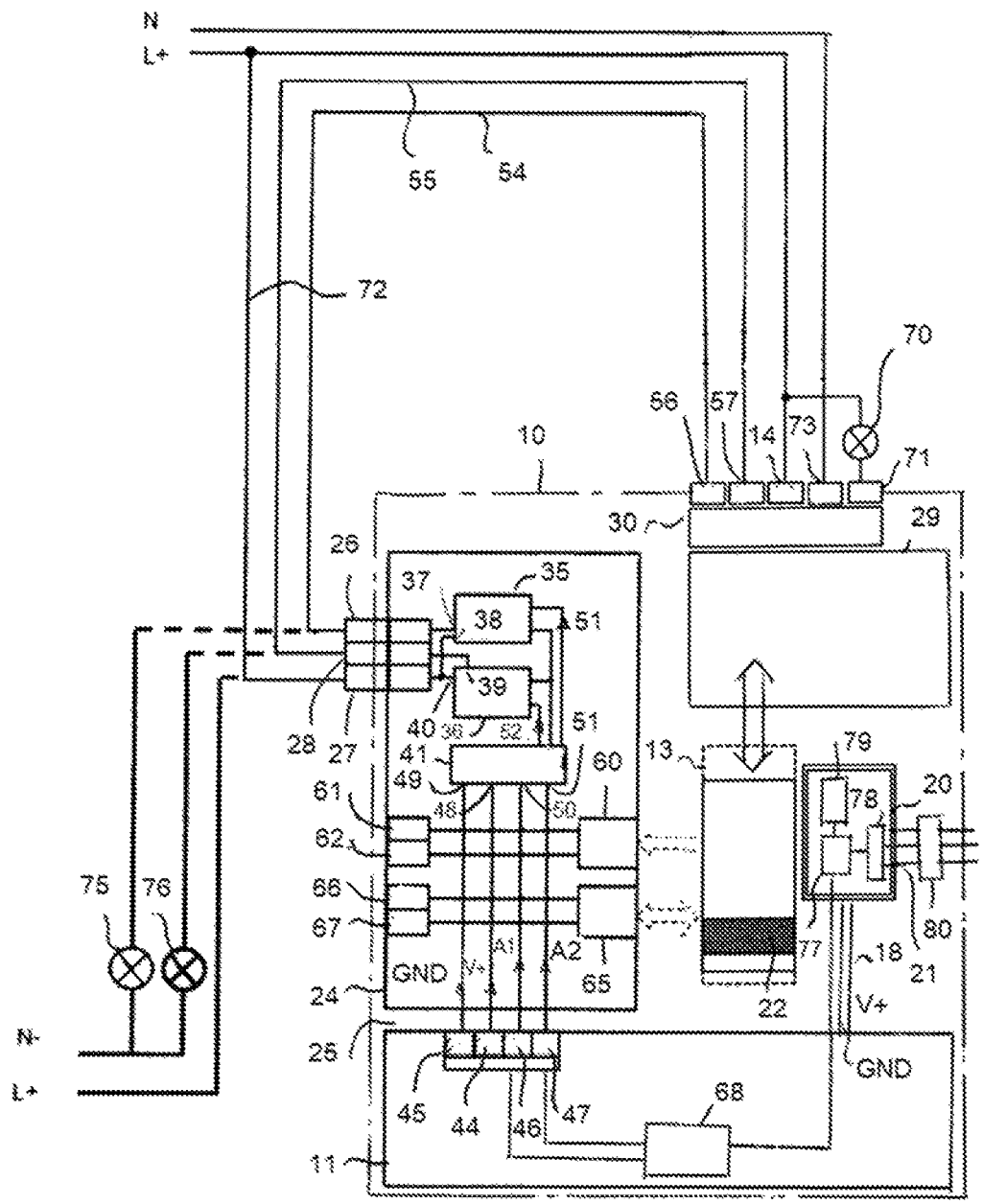

In an embodiment, the present invention provides a switching device and a control method which enable a control of functions by means of the control unit.

In an embodiment, a switching device includes an electronic trip unit, an actuator, and a switching mechanism which is coupled via the actuator to the electronic trip unit. Moreover, the switching device includes a stationary contact and a mobile contact which is coupled to the switching mechanism, and an alarm module. The alarm module includes a first, a second and a third connector, a first and a second relay, and a control unit. The first relay includes a first contact which is connected to the first connector and a second contact which is connected to the second connector. The second relay includes a first contact which is connected to the third connector. The control unit is coupled on the output side to a control side of the first relay and to a control side of the second relay and on the input side to the electronic trip unit.

Advantageously, the first and the second relay can be used for controlling different modules and devices. The electronic trip unit can thus act with the actuator upon the switching mechanism and with the first and the second relay upon different modules and devices.

In an embodiment, a second contact of the second relay is connected to the second connector of the alarm module or to a fourth connector of the alarm module.

In an embodiment, a current flowing through the mobile contact and through the stationary contact does not flow through an output side of the first relay and does not flow through an output side of the second relay.

In an embodiment, the switching device does not have a series circuit of the output side of the first relay and of the mobile and the stationary contact. Moreover, the switching device does not have a series circuit of the output side of the second relay and of the mobile and the stationary contact.

In an embodiment, a maximum value of a current which flows through the stationary and the mobile contact is greater than a maximum value of a current which flows through an output side of the first relay. The maximum value of the current which flows through the stationary and the mobile contact is greater than a maximum value of a current which flows through an output side of the second relay. In each case, maximum values can be predetermined maximum values or alternatively measured maximum values.

In an embodiment, the first, the second and the third connector of the alarm module and, if present, also the fourth connector of the alarm module are implemented in such a manner that lines can be connected from outside of the switching device to the connectors.

In an embodiment, the first, the second and the third connector of the alarm module are arranged on the front side of the switching device. If present, the fourth connector of the alarm module is also arranged on the front side of the switching device.

In an embodiment, the electronic trip unit includes a reference potential connector, a supply voltage connector, and at least one control connector, which are connected via lines to a reference potential input, to a supply voltage input, and to at least one control input of the control unit.

In an embodiment, a supply voltage on the supply voltage input of the control unit has at least a value of 10 volt.

In an embodiment, the switching device includes a remote drive unit which includes at least one control input and which is coupled to the switching mechanism.

The at least one control input of the remote drive unit can include a first and a second control input.

In an embodiment, a first control line connects the first connector of the alarm module to a first control input of the remote drive unit. A second control line connects the third connector of the alarm module to a second control input of the remote drive unit.

In an embodiment, the alarm module includes a leading auxiliary switch and two auxiliary switch connectors which are connected to connectors of the leading auxiliary switch.

In an embodiment, the leading auxiliary switch is implemented as normally open.

Alternatively, the leading auxiliary switch is implemented as normally closed.

In an embodiment, the two auxiliary switch connectors are implemented so that lines can be connected from outside of the switching device to the two auxiliary switch connectors. The two auxiliary switch connectors can be attached on the front side of the switching device. An actuator of the switching device can act, for example, on the leading auxiliary switch.

In an embodiment, the alarm module includes a tripping device and two tripping device connectors which are connected to connectors of the tripping device.

The tripping device can be implemented as an undervoltage release or shunt trip. The tripping device can act, for example, upon the switching mechanism.

The two tripping device connectors can be implemented as inputs.

In an embodiment, the two tripping device connectors are implemented so that lines can be connected from outside of the switching device to the two tripping device connectors. The two tripping device connectors can be attached on the front side.

In an embodiment, the switching device includes an interface module. The interface module includes an interface circuit and a signal processing unit which is coupled to the electronic trip unit and to the signal processing unit. The signal processing unit of the interface module can be implemented as a microcontroller or a microprocessor.

In an embodiment, the switching device is coupled via the interface module to a bus. In an example, the interface module supports at least one bus protocol. The switching device can output data to the bus or receive data from the bus via the interface module. The bus can be connected directly to the interface module or coupled to the interface module.

The interface module can also be referred to as a breaker status module, abbreviated BSM.

In an embodiment, the switching device includes a housing. The electronic trip unit, the actuator, the switching mechanism, the stationary and the mobile contact, and the alarm module are arranged within the housing. The interface module can also be arranged within the housing. The housing can be implemented so it is openable. The housing can be openable on the front side, for example. The housing can be openable even when the housing is installed in an arrangement such as a switch cabinet. The housing can be openable for maintenance purposes. The housing can be openable so that a person can connect lines to the alarm module. Therefore, the housing is implemented so that it can be opened from the front side.

In an embodiment, the electronic trip unit includes a signal processing unit. The signal processing unit of the electronic trip unit can be coupled to a signal processing unit of the interface module. The electronic trip unit can be implemented as tripping electronics.

The switching device can be implemented as a protection device and/or power switch. The switching mechanism can be referred to as a contact system.

In an embodiment, the switching device includes a bus module. The bus module can be arranged, for example, in the housing of the switching device or it can be arranged immediately outside on the housing of the switching device. The bus module couples the interface module to the bus.

The interface module or the bus module can be implemented for at least one communication protocol such as, for example, fieldbus, MODBUS RTU communication, Modbus TCP, Ethernet, Profibus, Profibus DP, ProfiNet and/or SmartWire.

The switching device can implement a shunt release with relay function.

The switching device can include, for example, a combination of a shunt release (undervoltage release or shunt trip), a leading auxiliary switch and a signaling unit (including one or more relays, for example) in a subassembly. The signaling is formed via two electrically controllable triggers. Control takes places electrically via the tripping electronics of the switching device.

In an embodiment, in a protection device such as a power switch, one or more electronic trip units (tripping devices) are present, which acquire the operating conditions, that is to say the current flow through the switch, and accordingly act via actuators upon the switching mechanism, in order to open the contact system of the switch in the case of overload or short circuit, as a function of the load and corresponding presettings.

Shunt releases are conventional actuators which are used in connection with protection devices, for example, compact power switches used in energy distribution. In switch constructions, these tripping devices can be offered as accessory parts, for example, which can be installed on the client side in the protection device. For that purpose, corresponding installation spaces are present in the switching device.

Shunt releases enable the switching off or tripping of the protection switch by external electrical signals. In particular in combination with electronic trip units, the possibility exists of acquiring the load conditions in the installation or in the switching device and reporting corresponding load states from the switching device. For this purpose, external or internal notification units can be used, which work together with additional external devices, for example. The notification units work together electrically with the tripping device of the power switch. For the installation of these units, additional space requirements and wiring effort may be necessary.

In an embodiment, the notification units are integrated into the housing of the power switch in order to minimize the space requirement and the wiring effort. In an example, a switching device combines an undervoltage release, a leading auxiliary switch, abbreviated HIV, and a motor drive control.

In this case, the installation spaces for accessory components and the functions of the internal accessories of the power switches can advantageously be maintained unchanged. In an embodiment, in particular a subsequent installation and exchange of the components as well as a combination of the functions of shunt release, auxiliary switch, signaling and notification unit are possible. The switching device can advantageously implement a combination of the functional units of a shunt release with leading auxiliary switch and of a notification unit in the available installation space of the shunt release in a switching device.

In an embodiment, the connectors of the alarm module are implemented as screw connectors or as push-in connectors or push-in terminals. The connectors are attached on at least one of the circuit boards of the alarm module. The connectors can be attached on one, two or three circuit boards of the alarm module, for example. In addition, electromechanical relays and a corresponding control unit which is implemented as control electronics are present on the circuit board. Moreover, a connection to an auxiliary switch is also integrated, said auxiliary switch being implemented, for example, as a leading auxiliary switch, abbreviated XHIV. The electric circuits of the alarm module are implemented with secure separation by means of appropriate contours and spacings. For this purpose, appropriate spacings are implemented between the subassemblies by means of slots and ribs.

The alarm module can be equipped in several functional variants and combinations. Advantageously, the connection of the alarm module to the electronic trip unit formed by a plug-in multi-pole line. Standard plugs are fastened by specific holders such as, for example, plug adaptors in the housing of the electronics, by firm bonding or positive locking connection to circuit board.

In an alternative embodiment, the relays are activated by a light guide connection. The relays can be implemented as notification relays.

In an embodiment, the first and the second relays are implemented as electromechanical relays. The first relay includes the control side which has an electric control circuit. The first relay includes an excitation coil, a ferromagnetic core, a movably mounted ferromagnetic armature arranged thereon, and the first and the second contact. A first control signal is supplied to the control side and flows in the form of a current through the excitation coil. The current in the excitation coil generates a magnetic flux through the core and the armature. In an air gap between core and armature, an application of force to the armature occurs. The movement of the armature switches the contact between the first and the second contact. As soon as no current flows in the excitation coil, the armature is reset back into the starting position by a spring. The second relay can be implemented like the first relay.

In an alternative embodiment, the first and the second relays are implemented as electronic relays or solid state relays. An electronic relay or a solid state relay includes a transistor, a thyristor or a triac. An electronic relay or a solid state relay can also include an optocoupler. The control side is connected to an optical transmitter, for example, an IR light emitting diode, of the optocoupler. The optocoupler includes an optical receiver such as, for example, a phototransistor (for example, photo-MOSFET), a photothyristor or a phototriac. The optical transmitter and the optical receiver are arranged in a housing and separated from one another by a transparent insulating material.

In an embodiment, the alarm module includes more than two relays which are controlled by the control unit and connected to connectors of the alarm module.

In an embodiment, a method for controlling two relays includes:
  provision of at least one output signal by an electronic trip unit,
  generation of a first and a second control signal by a control unit as a function of the at least one output signal,
  setting of a first relay as a function of the first control signal, and
  setting of a second relay as a function of a second control signal.

A switching device includes the electronic trip unit, an actuator, and a switching mechanism which is coupled via the actuator to the electronic trip unit. Moreover, the switching device includes a stationary contact and a mobile contact which is coupled to the switching mechanism. Furthermore, the electronic trip unit includes an alarm module which includes the first and the second relay and the control unit.

Advantageously, the first and the second relay can be set by the electronic trip unit. By means of the first and the second relay, light sources for the display, a remote drive unit of the switching device, an additional switching device or other modules or devices can be controlled. The method for controlling two relays can be carried out, for example, by the switching device according to the above-described embodiments.

FIG. 1A shows an example of a switching device 10. The switching device 10 can be implemented, for example, as a power switch, a motor protection switch, a power protection switch, a compact power switch or a load separation switch. The switching device 10 includes an electronic trip unit 11, an actuator 12, and a switching mechanism 13. The abbreviation of electronic trip unit 11 is ETU. Moreover, the switching device 10 includes a first and a second connector 14, 15 which are connected to a stationary and to a mobile contact 16, 17 of the switching device 10. The electronic trip unit 11 is coupled on the output side to the actuator 12. The actuator 12 can be an electromechanical actuator. The actuator 12 can be implemented, for example, as a coil or piezoelectric element. The actuator 12 generates a force which acts upon the switching mechanism 13. If the actuator 12 is implemented as a coil, then the coil generates a magnetic field which acts upon the switching mechanism 13.

The switching mechanism 13 is designed to separate the mobile contact 17 from the stationary contact 16. Moreover, the switching mechanism 13 is designed to connect the mobile contact 17 to the stationary contact 16, so that a current I flows through the first and the second connector 14, 15. Thus, the electronic trip unit 11 is configured so as to separate the mobile contact 17 from the stationary contact 16 by means of the actuator 12 and the switching mechanism 13, and thus to interrupt a flow of a current I or to bring the mobile contact 17 in contact with the stationary contact 16 and thus enable the flow of the current I. Moreover, the switching device 10 can comprise an arcing chamber 19 which is provided for extinguishing an electric arc occurring between the mobile and the stationary contact 16, 17.

Additionally, the switching device 10 includes an alarm module 24. The alarm module 24 is coupled via a line arrangement 25 of the switching device 10 to the electronic trip unit 11. Moreover, the alarm module 24 comprises connectors 26 to 28. The connectors can be a first, a second and a third connector 26 to 28. The connectors 26 to 28 of the alarm module 24 can be external connectors of the switching device 10.

Moreover, the switching device 10 can include a remote drive unit 29 and a connector arrangement 30. The connector arrangement 30 is connected to the remote drive unit 29. Furthermore, the remote drive unit 29 is coupled to the switching mechanism 13. The connectors of the connector arrangement 30 can be external connectors of the switching device 10.

In addition, the switching device 10 includes an interface module 20. The interface module 20 is coupled via a line arrangement 18 of the switching device 10 to the electronic trip unit 11. Moreover, the interface module 20 comprises interface lines 21. The interface lines 21 can be led to the outside, for example. A bus can be connected to the interface lines 21.

The switching device 10 includes in addition an actuator 22 which acts upon the switching mechanism 13. The actuator 22 is implemented in such a manner that a person can use the actuator 22 in order to bring the mobile contact 17 in contact with the stationary contact 16 or to separate the mobile contact 17 from the stationary contact 16.

FIG. 1B shows an example of the switching device 10 which is a development of the switching device shown in FIG. 1A. The alarm module 24 includes the first, the second and the third connector 26 to 28. Moreover, the alarm module 24 includes a first and a second relay 35, 36. The first relay 35 includes a first contact 37 which is connected to the first connector 26 of the alarm module 24 and a second contact 38 which is connected to the second connector 27 of the alarm module 24. The second relay 36 includes a first contact 39 which is connected to the third contact 28 of the alarm module 24 and a fourth contact 40 which is also connected to the second connector 27 of the alarm module 24. A control unit 41 of the alarm module 24 is connected on the output side to a control side of the first relay 35 and to a control side of the second relay 36. On the input side, the control unit 41 is coupled to the electronic trip unit 11 via the line arrangement 25.

The electronic trip unit 11 comprises several connectors 44 to 47 which are coupled to connectors of the control unit 41 via the line arrangement 25. Thus, the electronic trip unit 11 includes a supply voltage connector 44 which is connected to a supply voltage input 48 of the control unit 41. Moreover, the electronic trip unit 11 includes a reference potential connector 45 which is connected to a reference potential input 49 of the control unit 41. Furthermore, the electronic trip unit 11 includes a control connector 46 which is connected to a control input 50 of the control unit 41. The electronic trip unit 11 can comprise an additional control connector 47 which is connected to an additional control input 51 of the control unit 41. The control unit 41 can include, for example, a microprocessor, a microcontroller, a logic gate and/or a state machine.

A supply voltage V+ is applied on the supply voltage connector 44 and on the supply voltage input 48 of the control unit 41. The supply voltage V+ has at least a value of 10 volt. The supply voltage V+ can be 24 volt, for example. Advantageously, the supply voltage V+ is sufficiently high that it can switch the first and the second relay 35, 36.

A reference potential GND is applied on the reference potential connector 45 and on the reference potential input 49 of the control unit 41.

A first control line 54 connects the first connector 26 of the alarm module 24 to a first control input 56 of the connector arrangement 30 and thus to the remote drive unit 29. A second control line 55 connects the third connector 28 of the alarm module 24 to a second control input 57 of the connector arrangement 30 and thus to the remote drive unit 29.

The interface module 20 includes a signal processing unit 77. The signal processing unit 77 can include a microprocessor, a microcontroller, a logic gate and/or a state machine.

The interface module 20 includes an interface circuit 78. The interface circuit 78 couples the interface lines 21 to the signal processing unit 77. The interface circuit 69 can be implemented, for example, as a field bus module, a Modbus module, a media converter, an interface converter or an interface module (also called a transceiver). For example, a media converter can convert an electrical signal into an optical signal and vice versa.

Moreover, the interface module 20 includes a detection unit 79. The detection unit 79 is connected to the signal processing unit 77. The detection unit 79 carries out a position detection, for example. The detection unit 79 can acquire, for example, the position of the actuator 22. The detection unit 79 detects, for example, an ON state, an OFF state, and a triggering state of the switching device 10.

The interface module 20 is connected via the line arrangement 18 to the electronic trip unit 11. Thus, a plurality of lines leads from the interface module 20 to the electronic trip unit 11. Thus, for example, the interface module 20 can supply the alarm module 24 and other modules in the switching device 10 with the supply voltage V+ and the reference potential GND via the electronic trip unit 11.

Optionally, the switching device 10 includes a bus module 80. The bus module 80 is connected via the interface lines 21 to the interface module 20 and namely to the interface circuit 78. The bus module 80 is connected on the other side to a bus. The bus module 80 can be implemented as a field bus module, a Modbus module, a media converter, an interface converter or an interface module (also called a transceiver). The bus module 80 can be arranged in a housing 23 of the switching device 10 (as shown, for example, in FIG. 3B).

The electronic trip unit 11 can include a signal processing unit 68. The signal processing unit 68 of the electronic trip unit 11 is coupled to the signal processing unit 77 of the interface module 20 and to the actuator 12. The signal processing unit 68 can be coupled to the control unit 41 via the line arrangement 25. The signal processing unit 68 of the electronic trip unit 11 can include a microprocessor, a microcontroller, a logic gate and/or a state machine.

The electronic trip unit 11 provides an output signal A1 at the control connector 46, which is supplied to the control input 50 of the control unit 41. The signal processing unit 68 of the electronic trip unit 11 generates, for example, the output signal A1. The control unit 41 generates a first control signal S1 as a function of the output signal A1. The first control signal S1 is supplied to the control side of the first relay 35 and sets the first relay 35.

Accordingly, the electronic trip unit 11 provides an additional output signal A2 to the additional control connector 47, which is supplied to the additional control input 51 of the control unit 41. The signal processing unit 68 of the electronic trip unit 11 generates, for example, the additional output signal A2. The control unit 41 generates a second control signal S2 as a function of the additional output signal A2. The second control signal S2 is supplied to the control side of the second relay 36 and sets the second relay 36. The first and second relays 35, 36 control, for example, the remote drive unit 29.

The electronic trip unit 11 can generate, for example, the output signal A1 and the additional output signal A2 using information which the electronic trip unit 11 itself determines, for example by means of a current sensor or another detector of the electronic trip unit 11. The current sensor detects, for example, the current I flowing through the stationary and the mobile contact 16, 17.

Alternatively, the interface module 20 can determine information which is supplied to the electronic trip unit 11 and used by the electronic trip unit 11 for the generation of the output signal A1 and of the additional output signal A2. The electronic trip unit 11 can use, for example, the information determined by the detection unit 79 of the interface module 20.

Alternatively, information can be supplied via the bus and the interface module 20 to the electronic trip unit 11. The electronic trip unit 11 generates the output signal A1 and the additional output signal A2 as a function of the information transmitted via the bus. Thus, the first and the second relay 35, 36 can be remote controlled via the bus.

Thus, the electronic trip unit 11 determines the output signal A1 and the additional output signal A2 as a function of the information transmitted via the bus, which is determined by the interface module 20 and which is determined by the electronic trip unit 11. The different information items can be used linked or separately.

The first, the second and the third connector 26 to 28 of the alarm module 24 can be external connectors of the switching device 10.

Moreover, the alarm module 24 includes a leading auxiliary switch 60 and two auxiliary switch connectors 61, 62 which are connected to connectors of the leading auxiliary switches 60.

The two auxiliary switch connectors 61, 62 can be implemented as inputs. Between the two auxiliary switch connectors 61, 62, the voltage of a phase or of a signal derived from this voltage can be applied. The leading auxiliary switch 60 can be implemented, for example, as normally open. The leading auxiliary switch 60 can be separated galvanically from the electronic trip unit 11 and the control unit 41. The two auxiliary switch connectors 61, 62 can be external connectors of the switching device 10. The alarm module 24 can implement an auxiliary switch function by means of the leading auxiliary switch 60 and the two auxiliary switch connectors 61, 62.

The leading auxiliary switch 60 is connected to the switching mechanism 13. The leading auxiliary switch 60 can be coupled via the switching mechanism 13 to the actuator 22. The actuator 22 acts via the switching mechanism 13 on the leading auxiliary switch 60. A movement of the actuator 22 by a person triggers a switching of the leading auxiliary switch 60. If, for example, the actuator 22 is moved, then the leading auxiliary switch 60 switches over before the mobile contact 17 and the stationary contact 16 carry out a switching procedure.

If the actuator 22 is moved, for example, from the OFF position to the ON position, then the leading auxiliary switch 60 switches over before the mobile contact 17 contacts the stationary contact 16. The leading auxiliary switch 60 can here switch from open to conducting, for example. A conducting leading auxiliary switch 60 electrically connects the two auxiliary switch connectors 61, 62 in a conducting manner; in the case of an open leading auxiliary switch 60, the two auxiliary switch connectors 61, 62 are separated.

The alarm module 24 can have just one circuit board on which the first and second relays 35, 36, the control unit 41, and the first, second and third connectors 26 to 28 are attached. The two auxiliary switch connectors 61, 62 and the leading auxiliary switch 60 can also be attached on this circuit board.

Alternatively, the two auxiliary switch connectors 61, 62 and the leading auxiliary switches 60 are attached on an additional circuit board of the alarm module 24.

In addition, the alarm module 24 includes a tripping device 65 and two tripping device connectors 66, 67 which are connected to connectors of the tripping device 65. The two tripping device connectors 66, 67 can be implemented as inputs and outputs. The tripping device 65 can be implemented as an undervoltage release, abbreviated UVR, or a shunt trip, abbreviated ST. The tripping device 65 can be separated galvanically from the electronic trip unit 11 and the control unit 41. The two tripping device connectors 66, 67 can be external connectors of the switching device 10.

The tripping device 65 is connected to the switching mechanism 13. The tripping device 65 acts upon the switching mechanism 13. The tripping device 65 can set the switching device 10 to a so-called trip setting. If the actuator 22 is moved, for example, from the OFF position to the ON position, and if the tripping device 65 has been tripped, then the switching device 10 is set to the trip setting. In the trip setting, the mobile contact 17 is not brought in contact with the stationary contact 16, even in the case of a movement of the actuator 22 into the ON position. The alarm module 24 can implement a trip setting function by means of the tripping device 65 and of the tripping device connectors 66, 67. The trip setting function can implement, for example, an undervoltage release and/or a shunt trip.

The tripping device 65 and the two tripping device connectors 66, 67 can also be attached to the circuit board, on which the first and second relays 35, 36, the control unit 41, and the first, second and third connectors 26 to 28 are attached, for example optionally together with the two auxiliary switch connectors 61, 62 and the leading auxiliary switch 60.

Alternatively, the tripping device 65 and the two tripping device connectors 66, 67 are attached to the additional circuit board, on which the two auxiliary switch connectors 61, 62 and the leading auxiliary switch 60 can be attached.

Again alternatively, the tripping device 65 and the two tripping device connectors 66, 67 are attached to an additional circuit board of the alarm module 24.

A phase L+ can be connected to the first connector 14. The phase L+ can be connected via a light source 70 to a connector 71 of the switching device 10. The light source 70 can include a light emitting diode, for example.

The second connector 27 of the alarm module 24 can be connected via a third control line 72 to the phase L+. Thus, a voltage applied on the phase L+ is led via the first relay 35 to the first control input 56 of the connector arrangement 30 when the output side of the first relay 35 is switched to be conducting. Accordingly, a voltage applied on the phase L+ is led via the second relay 36 to the second control input 57 of the connector arrangement 30 when the output side of the second relay 36 is switched to be conducting. A neutral conductor N can be connected to an additional connector 73 of the switching device 10.

The first, second and third control lines 54, 55, 72 can be lines outside of the switching device 10. The first, second and third control lines 54, 55, 72 can be attached, for example, during the assembly of the switching device 10. Alternatively, the first, second and third control lines 54, 55, 72 can be installed within the housing 23 of the switching device 10.

In an alternative embodiment which is indicated with broken lines, the first connector 26 of the alarm module 24 is connected via a first light source 75 to the neutral conductor N−. Likewise, the third connector 28 of the alarm module 24 is connected via a second light source 76 to the neutral conductor N−. The second connector 27 of the alarm module 24 is connected to the phase L+. The first and third connectors 26, 28 of the alarm module 24 thus have no connection to the remote drive unit 29. The electronic trip unit 11 controls the first and second relays 35, 36 via the control unit 41, in order to signal states of the switching device 10 and/or of the electronic trip unit 11, such as, for example, a thermal overload trip, thermal overload pre-alarm, a ground fault trip, and an active maintenance operation mode. For example, the first relay 35 is triggered in the case of a thermal overload. The second relay 36 can be triggered, for example, in the case of the thermal pre-alarm, of the ground fault or of the active maintenance operation mode.

The switching device 10 can be implemented as a molded case circuit breaker, abbreviated MCCB. The switching device 10 can comprise different MCCB tripping mechanisms including a thermal-magnetic tripping and/or an electronic tripping. In the case of an electronic tripping, the current I is measured with a current sensor and the tripping is brought about by a comparison of the measured values with specified values. For this purpose, the switching device 10 can comprise, for example, a microprocessor as signal processing unit 68.

The remote drive unit 29 can act on these tripping device conditions and for that purpose it is coupled to the switching mechanism 13 and/or the actuator 12.

In an alternative embodiment, the second contact 40 of the second relay 35 is connected to a fourth connector of the alarm module 24.

In an alternative embodiment, the additional control connector 47, the additional control input 51, and the line in between are omitted. The output signal A1 here contains the information for the generation of both the first and the second control signal S1, S2. The control unit 41 generates the second control signal S2 as a function of the output signal A1. This information is coded, for example, serially in the output signal A1.

In an alternative embodiment, the tripping device 65 and the two tripping device connectors 66, 67 can be omitted. The alarm module 24 is thus implemented without the tripping device 65 and the two tripping device connectors 66, 67.

In an alternative embodiment, the leading auxiliary switch 60 and the two auxiliary switch connectors 61, 62 can be omitted. The alarm module 24 is thus implemented without the leading auxiliary switch 60 and the two auxiliary switch connectors 61, 62.

Figure 2:
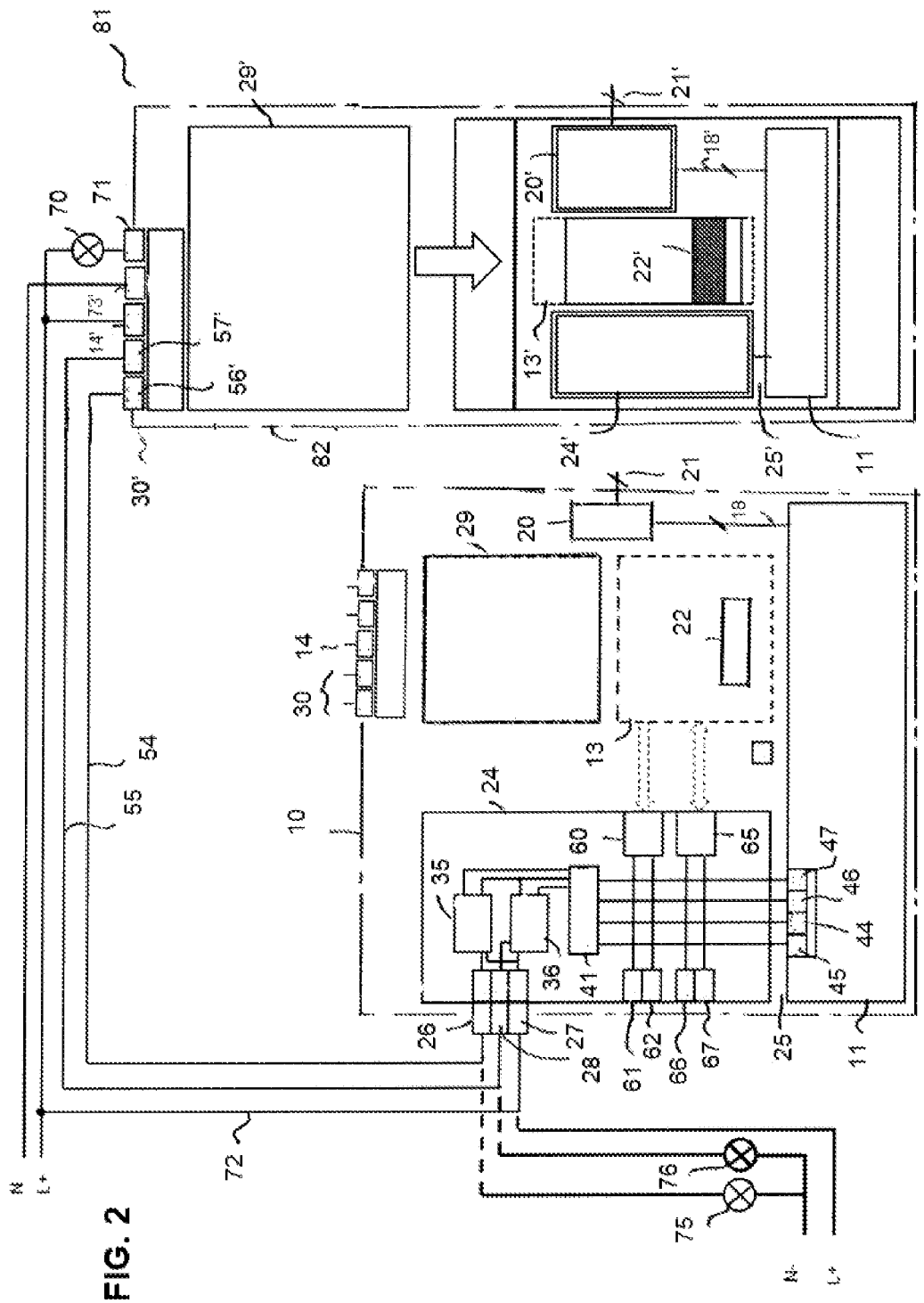
FIG. 2 shows an example of an arrangement with two switching devices.

FIG. 2 shows an example of an arrangement 81 with two switching devices. The arrangement 81 includes the switching device 10 and an additional switching device 82 which can be implemented like the switching device 10. The additional switching device 82 includes an additional electronic trip unit 11', an additional switching mechanism 13', an additional first connector 14', an additional actuator 22', an additional remote drive unit 29', and an additional connector arrangement 30'. Although not shown in FIG. 2, the additional switching device 82 includes an additional actuator, an additional second connector, an additional stationary contact and an additional mobile contact, an additional arcing chamber, and an additional housing as well as the corresponding connectors 21' and lines 18', 25'. The additional switching device 82 can optionally include an additional interface module 20'. The additional switching device 82 can also include, for example, an additional alarm module 24'.

The switching device 10 controls the additional switching device 82. More precisely, the alarm module 24 of the switching device 10 controls the additional remote drive unit 29' of the additional switching device 82.

The first control line 54 connects the first connector 26 of the alarm module 24 of the switching device 10 to an additional first control input 56' of the additional connector arrangement 30' of the additional switching device 82. The second control line 55 connects the third connector 28 of the alarm module 24 of the control device 10 to an additional second control input 57' of the additional connector arrangement 30' of the additional switching device 82. The additional connector arrangement 30' is connected to the additional remote drive unit 29'. Advantageously, the switching device 10 and additional switching device 82 can thus be linked to one another. For example, the switching device 10 can control and, for example, lock the additional switching device 82.

Figure 3A:
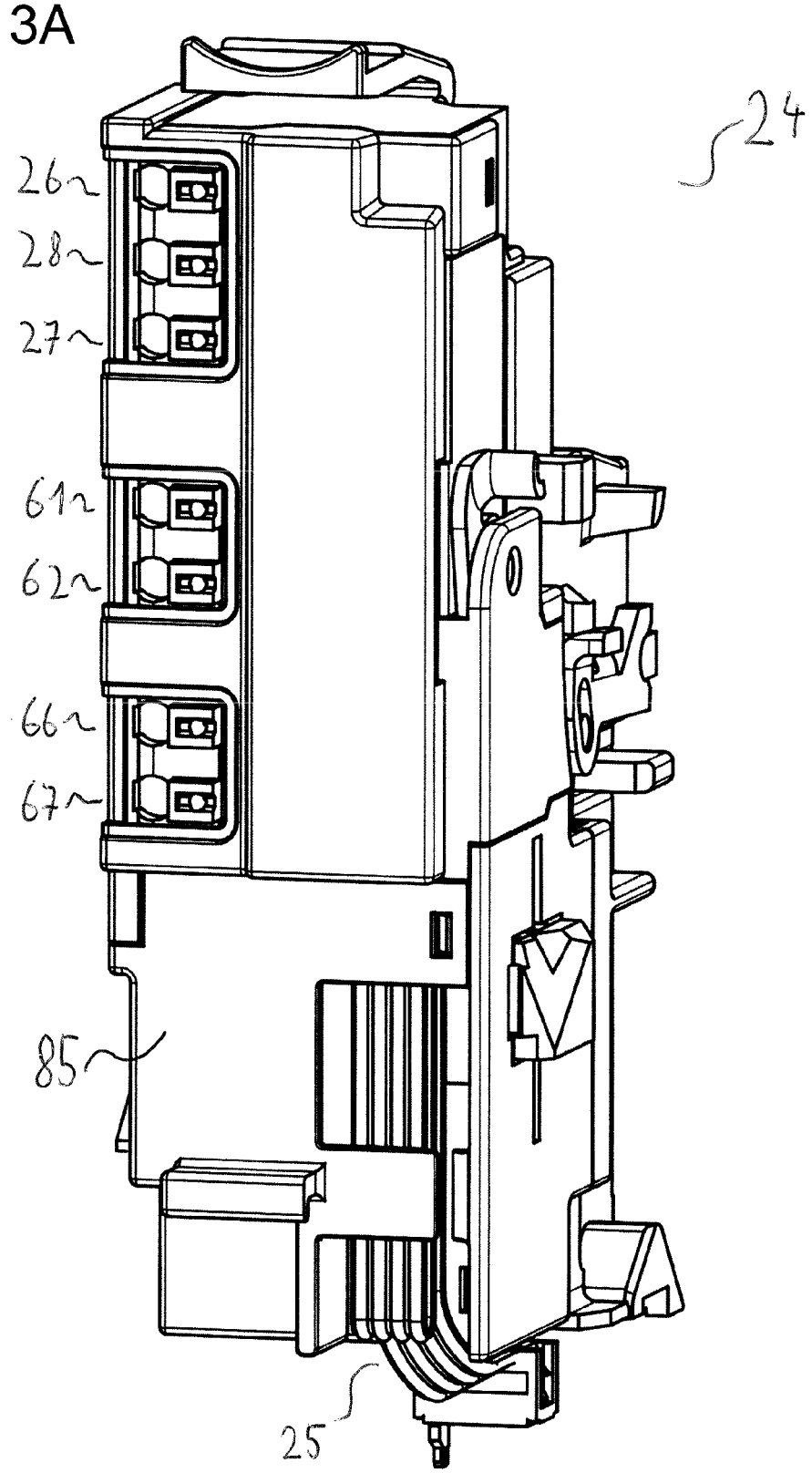
FIGS. 3A and 3B show examples of an alarm module and of a switching device in a perspective representation.

FIG. 3A shows an example of the alarm module 24 in a perspective representation, which is a variant of the above-shown embodiments. The alarm module 24 comprises a housing 85. The line arrangement 25 which couples the electronic trip unit 11 to the control unit 41 of the alarm module 24 is implemented as a ribbon cable, for example, with four cores. The first, second and third connectors 26 of 28 of the alarm module 10 are implemented as push-in connectors or push-in terminals. In the same way, the two auxiliary switch connectors 61, 62 can be produced as push-in connectors or push-in terminals. The two tripping device connectors 66, 67 can be formed as push-in connectors or plug-in terminals.

Advantageously, in the housing 85 of the alarm module 24, three functions are implemented, namely a relay function by means of the first and second relays 35, 36, the auxiliary switch function by means of the leading auxiliary switch 60, and the trip setting function by means of the tripping device 65. The alarm module 24 enables the compact implementation of these three functions in the switching device 10.

Alternatively, the two auxiliary switch connectors 61, 62 are omitted when the alarm module 24 is implemented without the leading auxiliary switch 60.

Alternatively, the two tripping device connectors 66, 67 are omitted when the alarm module 24 is implemented without the tripping device 65.

The alarm module 24 can thus have exclusively the relay function. Alternatively, the alarm module 24 has the relay function and the auxiliary switch function. Again alternatively, the alarm module 24 has the relay function and the trip setting function. Again alternatively, the alarm module 24 has the relay function, the auxiliary switch function, and the trip setting function.

Figure 3B:
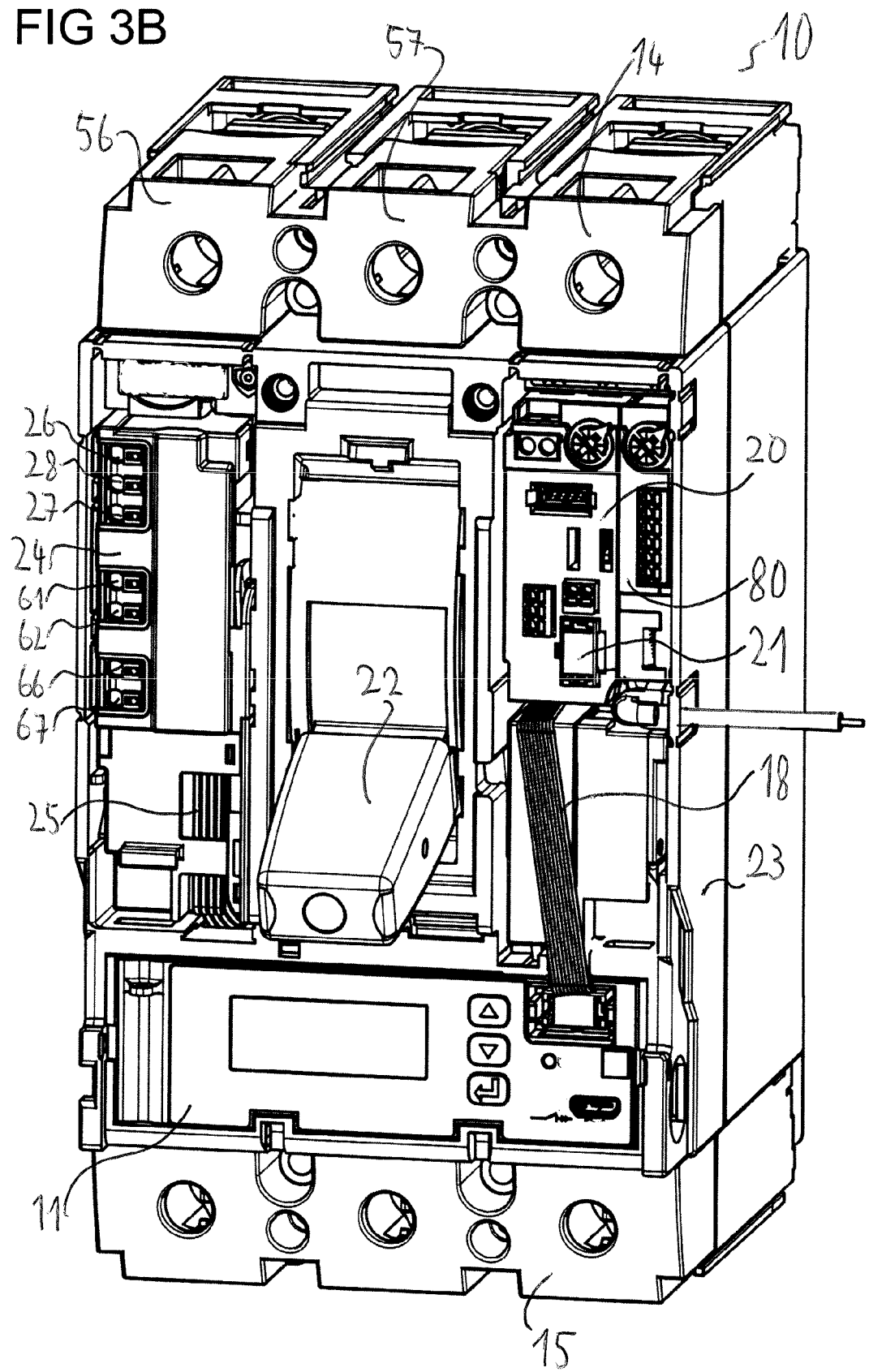

FIG. 3B shows an example of the switching device 10 in a perspective representation, which is a development of the above-shown embodiments. In FIG. 3B, substantially the front side of the switching device 10 is shown. The housing 23 of the switching device 10 can be opened by a person. The housing 23 has a movable cover on the front side. The movable cover has an opening so that a person has access to the actuator 22.

On the front side of the switching device 10, the electronic trip unit 11, the alarm module 24, the actuator 22, and the interface module 20 are arranged. The line arrangement 18 is implemented as a ribbon cable, for example, with ten cores. The interface lines 21 lead from the interface module 20 to the bus module 80. The bus module 80 can be connected to a bus. The bus module 80 is arranged in the housing 23 of the switching device 10. On the backside of the switching device 10, a fastening arrangement of the switching device 10 is located, for example, for fastening the switching device 10 in a switch cabinet. Alternatively, the bus module 80 is arranged outside of the housing 23 of the switching device 10.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

10 Switching device
11, 11' Electronic trip unit
12 Actuator
13, 13' Switching mechanism
14, 15, 14' Connector
16 Stationary contact
17 Mobile contact
18, 18' Line arrangement
19 Arcing chamber
20, 20' Interface module
21, 21' Interface lines
22, 22' Actuator
23 Housing
24, 24' Alarm module
25 Line arrangement
26 First connector
27 Second connector
28 Third connector
29, 29' Remote drive unit
30, 30' Connector arrangement
35 First relay
36 Second relay
37 First contact
38 Second contact
39 First contact
40 Second contact
41 Control unit
44 Supply voltage connector
45 Reference potential connector
46, 47 Control connector
48 Supply voltage input
49 Reference potential input
50, 51 Control input
54 First control line
55 Second control line
56, 56' First control input
57, 57' Second control input
60 Leading auxiliary switch
61, 62 Auxiliary switch connector
65 Tripping device
66, 67 Tripping device connector
68 Signal processing unit
70 Light source
71 Connector
72 Third control line
73, 73' Additional connector
75 First light source
76 Second light source
77 Signal processing unit
78 Interface circuit
79 Detection unit
80 Bus module
81 Arrangement
82 Additional switching device
85 Housing
A1 Output signal
A2 Additional output signal
I Current
GND Reference potential
L+ Phase
N, N− Neutral conductor
S1, S2 Control signal
V+ Supply voltage

What is claimed is:

1. A switching device, comprising:
an electronic trip unit;
an actuator;
a switching mechanism connected via the actuator to the electronic trip unit;
a stationary contact;
a mobile contact, which is coupled to the switching mechanism; and
an alarm module, the alarm module comprising:
a first, a second, and a third connector;
a first relay having a first contact which is connected to the first connector and having a second contact which is connected to the second connector;
a second relay with a first contact which is connected to the third connector; and
a control unit which is coupled on an output side to a control side of the first relay and to a control side of the second relay, and on an input side to the electronic trip unit.

2. The switching device according to claim 1, wherein a second contact of the second relay is connected to the second connector of the alarm module or to a fourth connector of the alarm module.

3. The switching device according to claim 1, wherein a current flowing through the mobile contact and the stationary contact does not flow through an output side of the first relay and does not flow through an output side of the second relay.

4. The switching device according to claim 1, wherein a maximum value of a current which flows through the stationary and the mobile contact is greater than a maximum value of a current which flows through an output side of the first relay and greater than a maximum value of a current which flows through an output side of the second relay.

5. The switching device according to claim 1, wherein the first, the second, and the third connector of the alarm module are configured such that lines are connectable from outside of the switching device to these connectors.

6. The switching device according to claim 1, wherein the electronic trip unit comprises a supply voltage connector, a reference potential connector, and at least one control connector, which are connected via a line arrangement of the switching device to a supply voltage input, to a reference potential input, and to at least one control input of the control unit.

7. The switching device according to claim 1, wherein the switching device comprises a remote drive unit which is coupled to a connector arrangement and to the switching mechanism.

8. The switching device according to claim 1, further comprising:

a first control line that connects the first connector of the alarm module to a first control input of a connector arrangement; and a second control line that connects the third connector of the alarm module to a second control input of the connector arrangement.

9. The switching device according to claim 1, wherein the alarm module comprises a leading auxiliary switch and two auxiliary switch connectors which are connected to connectors of the leading auxiliary switch.

10. The switching device according to claim 1, wherein the alarm module comprises a tripping device and two tripping device connectors which are connected to connectors of the tripping device.

11. A control method, comprising:
 providing a switching device, the switching device comprising:
  an electronic trip unit,
  an actuator,
  a switching mechanism coupled to the electronic trip unit by the actuator,
  a stationary contact,
  a mobile contact connected to the switching mechanism, and
  an alarm module comprising a first relay, a second relay, and a control unit, the control unit comprising a supply voltage input, a reference potential input, and at least one control input;
 providing at least one output signal using the electronic trip unit;
 generating a first and a second control signal, using the control unit, as a function of the at least one output signal;
 setting the first relay as a function of the first control signal; and
 setting the second relay as a function of the second control signal.

* * * * *